United States Patent [19]

Nakazawa

[11] Patent Number: 5,191,403
[45] Date of Patent: Mar. 2, 1993

[54] RESIN-SEALED SEMICONDUCTOR DEVICE HAVING A PARTICULAR MOLD RESIN STRUCTURE

[75] Inventor: Tsutomu Nakazawa, Yokohama, Japan

[73] Assignee: Kabushiki Kaisha Toshiba, Kawasaki, Japan

[21] Appl. No.: 829,372

[22] Filed: Feb. 3, 1992

[30] Foreign Application Priority Data

Feb. 5, 1991 [JP] Japan .................................. 3-14532

[51] Int. Cl.⁵ ........................ H01L 23/28; H01L 23/30
[52] U.S. Cl. ...................................................... 257/787
[58] Field of Search ................................. 357/72, 68

[56] References Cited

U.S. PATENT DOCUMENTS 4,100,566 7/1978 Okikawa et al. ....................... 357/72

Primary Examiner—Rolf Hille
Assistant Examiner—S. V. Clark
Attorney, Agent, or Firm—Foley & Lardner

[57] ABSTRACT

A resin-sealed semiconductor device and a method for making the same are disclosed. The resin-sealed semiconductor device has a semiconductor chip, with a mold resin structure completely encapsulating and sealing the chip. The mold resin structure has resin upper and lower thicknesses, respectively, above and below the chip. The resin upper thickness is differentiated from the resin lower thickness so that the warp ratio of the resulting mold resin structure is more than 0.0025.

4 Claims, 4 Drawing Sheets

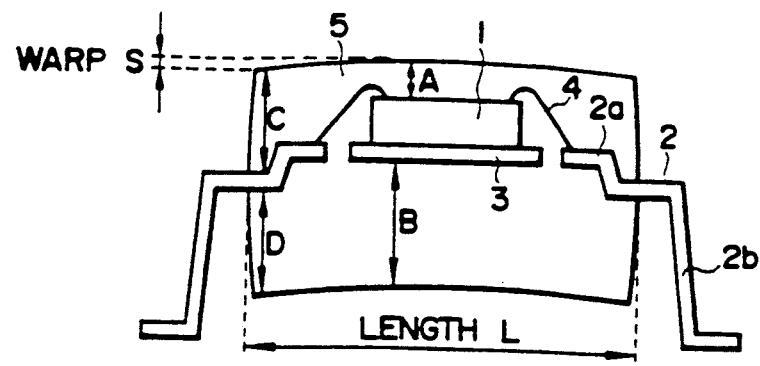
F I G. 1
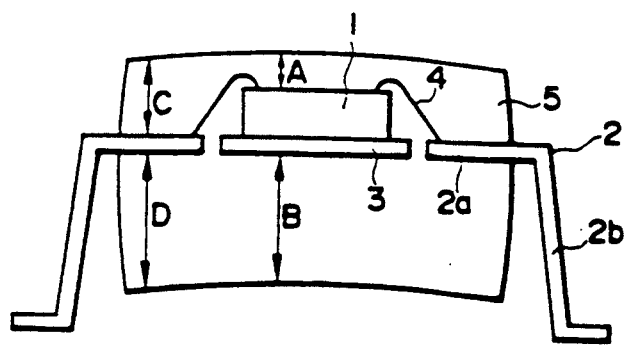
F I G. 2
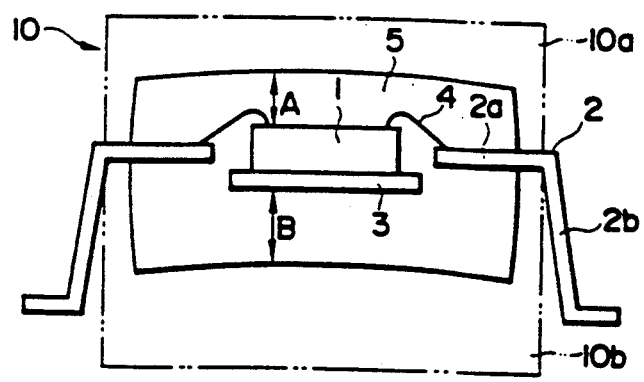
F I G. 3

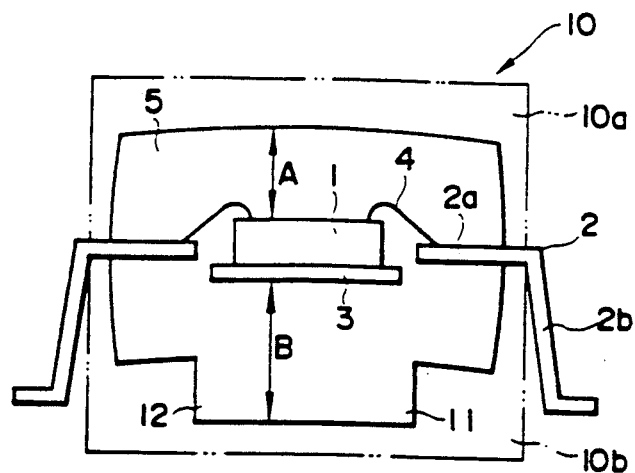
F I G. 4
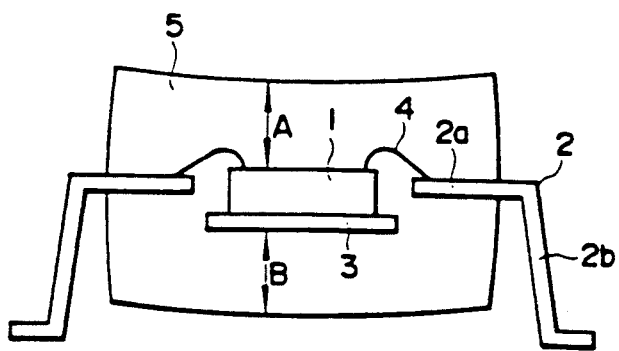
F I G. 5
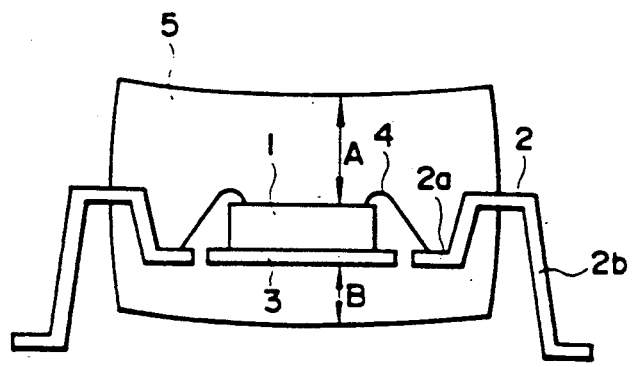
F I G. 6

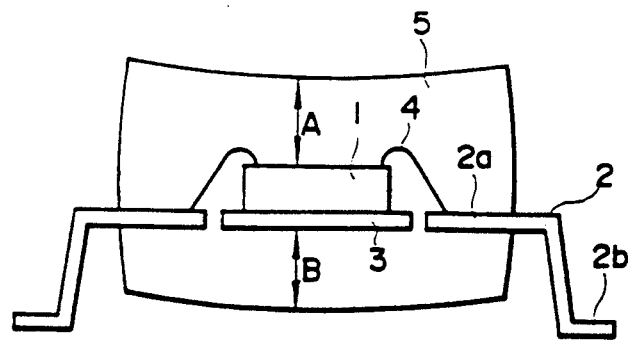
F I G. 7
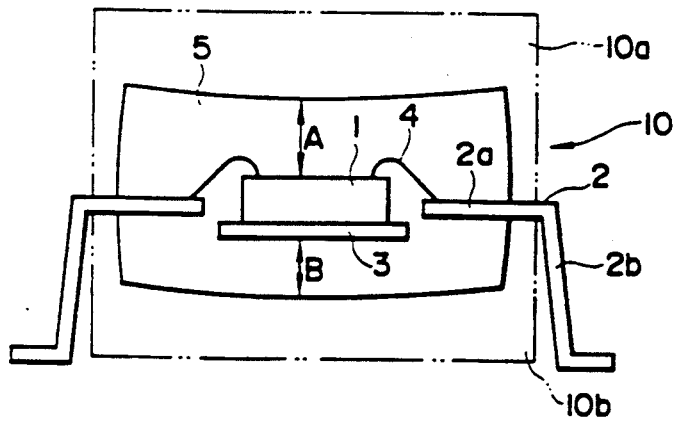
F I G. 8
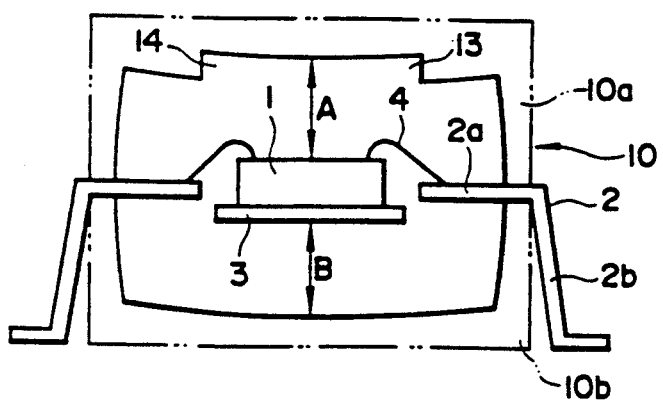
F I G. 9

RESIN-SEALED SEMICONDUCTOR DEVICE HAVING A PARTICULAR MOLD RESIN STRUCTURE

BACKGROUND OF THE INVENTION

The present invention relates to a resin-sealed semiconductor device and a method for making the same, and more particularly to a resin-sealed semiconductor device and a method for making the same in which a surface protection layer of a semiconductor chip can be effectively prevented from being broken.

FIGS. 11 and 12 illustrate conventional resin-sealed semiconductor devices. FIG. 11 is a cross-sectional view of a common and conventional resin sealed semiconductor device or a plastic package semiconductor device.

In FIG. 11, a semiconductor chip 1 is mounted on a bed 3 of a lead frame 2 and is connected to an inner lead 2a of the lead frame 2 by bonding wire 4. A mold resin structure 5 completely encapsulates and seals the semiconductor chip 1 and its adjacent wiring area, and an outer lead 2b of the lead frame 2 is shaped as shown, whereby the semiconductor device is obtained.

In FIG. 11, a resin upper thickness A of the mold resin structure 5 above the semiconductor chip 1 is equal to a resin lower thickness B of the mold resin structure 5 below the semiconductor chip 1, so that the mold resin structure 5 is not warped as a whole.

Numerous poor results have been obtained after a heat cycle test when the semiconductor chip 1 has a large size in dimensions as shown in FIG. 12, for the case of the semiconductor device of FIG. 11. The heat cycle test is considered as a thermal environment test equivalent to the use of the semiconductor device under thermal insulation, As the size of the semiconductor chip 1 increases, the passivation layer or a surface protection membrane of the semiconductor chip 1 tends to be broken after the heat cycle test. This problem causes such further problems as the cutting of bonding wires 4 connecting the semiconductor chip 1 and the lead frame 2 and infiltration of impurities or water into the broken passivation layer, resulting in corrosion of the bonding wires.

The breakage of the passivation layer is assumed to be caused as follows.

The mold resin structure 5 having a large coefficient of thermal expansion repeatedly undergoes great expansion and contractions with the change in temperature, whereas the semiconductor chip 1 having a small coefficient of thermal expansion undergoes relatively small expansion and contraction. The mold resin structure 5 applies a force onto the semiconductor chip 1 due to the difference of expansion between them. As the size of the semiconductor chip 1 becomes larger, the force applied by the mold resin structure 5 also becomes greater.

SUMMARY OF THE INVENTION

It is therefore an object of the present invention to provide a resin-sealed semiconductor device and a method for making the same, minimizing the breakage of the passivation layer of the semiconductor chip even in the case of a large semiconductor chip, thus solving the above described problem.

The above object of the invention can be achieved by a resin-sealed semiconductor device comprising: a semiconductor chip; a mold resin structure completely encapsulating and sealing the semiconductor chip with resin upper and lower thicknesses respectively above and below said chip; and an outer lead having a projecting part out of the mold resin structure and electrically connected to the semiconductor chip, wherein the resin upper thickness is differentiated from the resin lower thickness so that the warp ratio of the mold resin structure is more than 0.0025.

The above object can also be achieved by a method for making a resin-sealed semiconductor device comprising the steps of: electrically connecting a semiconductor chip to an outer lead, completely encapsulating and sealing the semiconductor chip with a mold resin structure having resin upper and lower thicknesses that are respectively above and below said chip; providing a projecting part of the outer lead projecting out of the mold resin structure, and defining a difference of thickness between the resin upper thickness and the resin lower thicknesses so that the warp ratio of the mold resin structure is more than 0.0025.

According to the present invention, the warp ratio of the mold resin structure is more than 0.0025, so that the force applied to the semiconductor chip by the mold resin structure is absorbed as the warp moment upon contraction of the mold resin after molding.

Further objects and advantages of the present invention will be apparent from the following description of the preferred embodiments of the invention as illustrated in the accompanying drawings.

BRIEF DESCRIPTION OF THE DRAWINGS

FIG. 1 is a cross-sectional side view showing a first embodiment of a resin-sealed semiconductor device according to the present invention;

FIG. 2 is a cross-sectional side view showing a second embodiment of the resin-sealed semiconductor device according to the present invention;

FIG. 3 is a cross-sectional side view showing a third embodiment of the resin-sealed semiconductor device according to the present invention;

FIG. 4 is a cross-sectional side view a fourth embodiment of the resin-sealed semiconductor device according to the present invention;

FIG. 5 is a cross-sectional side view a fifth embodiment of the resin-sealed semiconductor device according to the present invention;

FIG. 6 is a cross-sectional side view showing a sixth embodiment of the resin-sealed semiconductor device according to the present invention;

FIG. 7 is a cross-sectional side view showing a seventh embodiment of the resin-sealed semiconductor device according to the present invention;

FIG. 8 is a cross-sectional side view showing a eighth embodiment of the resin-sealed semiconductor device according to the present invention;

FIG. 9 is a cross-sectional side view showing a ninth embodiment of the resin-sealed semiconductor device according to the present invention;

DESCRIPTION OF THE PREFERRED EMBODIMENT

Figure 10:
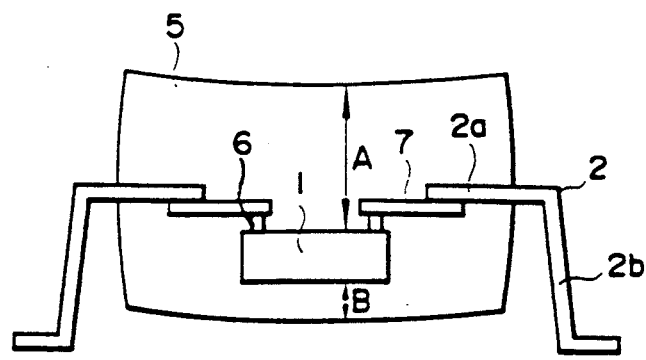
FIG. 10 is a cross-sectional side view showing a tenth embodiment of the resin-sealed semiconductor device according to the present invention.

Preferred embodiments of a resin-sealed semiconductor device according to the present invention will be described below with reference to the accompanying drawings.

FIG. 1 shows a first embodiment of the semiconductor device according to the present invention. In the resinsealed semiconductor device as shown in FIG. 1, a semiconductor chip 1 is mounted on a bed 3 of a lead frame 2, and bonding wires 4 are connected between an inner lead 2a of the lead frame 2 and the semiconductor chip 1. A mold resin structure 5 completely encapsulates and seals the semiconductor chip 1 and the adjacent wiring area thereof, and an outer lead 2b of the lead frame 2 is shaped as shown, whereby the semiconductor device is constituted. The bed 3 of the lead frame 2 and the inner lead 2 are pressed upwards to mount the semiconductor chip 1.

The thickness C of the mold resin structure 5 above the lead frame 2 is approximately equal to the thickness D of the mold resin structure 5 below the lead frame 2. However, the resin upper thickness A of the mold resin structure 5 above the semiconductor chip 1 is considerably smaller than the resin lower thickness B of the mold resin structure 5 below the semiconductor chip 1. As shown, the mold resin structure 5 is warped in a convex form on the side of the semiconductor chip 1 as a whole. This is because, after molding, the contraction of the upper portion of the mold resin structure 5 above the semiconductor chip 1 is interrupted by the semiconductor chip 1 having a small thermal expansion coefficient, whereas the contraction of the lower portion of the mold resin structure 5 below the semiconductor chip 1 is free without any interruption. The semiconductor device is warped in a convex form on the sides of the semiconductor chip 1, so that the warp ratio of the mold resin structure, S/L, is more than 0.005. The following is a description of a method for making the semiconductor device as shown in FIG. 1.

The lead frame 2 is preliminarily formed by etching or blanking. Then it is pressed upwards that the bed 3 and the inner lead 2a of the lead frame 2 protrude from the side of the semiconductor chip 1 to be mounted. Thereafter the semiconductor chip 1 is mounted on the bed 3. The inner leads 2a of the lead frame 2 and the semiconductor chip 1 are connected by the bonding wires 4. The semiconductor chip 1 and the adjacent wiring area are set in a metal mold thereafter. A resin is poured into the metal mold so that the semiconductor chip 1 and the adjacent area are completely encapsulated and resinsealed. Thereafter the outer lead 2b of the lead frame 2 is shaped as shown to obtain the semiconductor device.

According to such arrangement of the present embodiments where the semiconductor device is warped to have a warp ratio of the mold resin structure of more than 0.005, the force applied onto the semiconductor chip 1 by the mold resin structure 5 is absorbed as the warp moment upon contraction of the mold resin structure 5 formed in the metal mold. The breakage of the passivation layer of the semiconductor chip 1 is thus prevented accordingly.

FIG. 2 shows a second embodiment of the semiconductor device according to the present invention.

In the semiconductor device as shown in FIG. 2, a bed 3 and an inner lead 2a of a lead frame 2 are not pressed upwards, differing from the first embodiment, but the thickness C of a mold resin structure 5 above the lead frame 2 is made considerably smaller than the thickness D of the mold resin structure 5 below the lead frame 2. Therefore, a resin upper thickness A of the mold resin structure 5 above the chip 1 is smaller than a resin lower thickness B of the mold resin structure 5 below the chip 1, and the warp ratio of the mold resin structure is more than 0.005.

FIG. 3 shows a third embodiment of the semiconductor device according to the present invention.

As shown in FIG. 3, a bed 3 of a lead frame 2 is slightly pressed downwards with respect to the other portions of the lead frame 2. Further, the inner size of a top mold 10a of a metal mold 10 for resin sealing is smaller than that of a bottom mold 10b, whereby a resin upper thickness A of a mold resin structure 5 above a semiconductor chip 1 is smaller than a resin lower thickness B of the mold resin structure 5 below the semiconductor chip 1. The warp ratio of the mold resin structure of the present embodiment is more than 0.005.

FIG. 4 shows a fourth embodiment of the semiconductor device according to the present invention.

As shown in FIG. 4, a bed 3 of a lead frame 2 is also slightly pressed downwards with respect to the other portions of the lead frame 2. Further, the metal mold 10 for resin sealing has an inner recess 11 inside a bottom mold 10b of the metal mold 10, whereby a mold resin structure 5 has a protrusion 12 projecting downwards. Accordingly, a resin upper thickness A of the mold resin 5 above a semiconductor chip 1 is smaller than a resin lower thickness B of the mold resin 5 below the semiconductor chip 1. The warp ratio of the mold resin structure of the present embodiment is more than 0.005.

FIG. 5 shows the fifth embodiment of the semiconductor device according to the present invention.

In FIG. 5, a bed 3 of a lead frame 2 is pressed downwards with respect to the other portions of the lead frame 2. Therefore, a resin upper thickness A of a mold resin structure 5 above a semiconductor chip 1 is larger than a resin lower thickness B of the mold resin structure 5 below the semiconductor chip 1. Since the resin upper thickness A is larger than the resin lower thickness B, the mold resin structure 5 is warped as a whole into a concave form so that the side of the semiconductor chip 1 or the upper side is recessed. The warp ratio of the mold resin structure of the present embodiment is more than 0.005.

FIG. 6 shows a sixth embodiment of the semiconductor device according to the present invention.

As shown in FIG. 6, a bed 3 and an inner lead 2a are pressed considerably downwards with respect to the other portions of a lead frame 2. A resin upper thickness A of a mold resin structure 5 above a semiconductor chip 1 is considerably larger than a resin lower thickness B of the mold resin structure 5 below the semiconductor chip 1. Accordingly, the semiconductor device as shown in FIG. 6 has a further greater warp ratio of the mold resin structure 5 as compared with that of FIG. 5.

FIG. 7 shows a seventh embodiment of the semiconductor device according to the present invention.

As shown in FIG. 7, a bed 3 and an inner lead 2a of a lead frame 2 are located approximately at the same level as the other portions of the lead frame 2. A resin upper thickness A of a mold resin structure 5 above a semiconductor chip 1 is slightly larger than a resin lower thickness B of the mold resin structure 5 below the semiconductor chip 1. The mold resin structure 5 is warped in a concave form on the upper side of the mold resin structure 5, so that the warp ratio of the resin structure 5 is more than 0.005.

FIG. 8 shows an eighth embodiment of the semiconductor device according to the present invention.

As shown in FIG. 8, a bed 3 of a lead frame 2 is slightly pressed downwards with respect to the other portions of a lead frame 2. An inner size of a bottom mold 10b of a metal mold 10 for resin sealing is smaller than that of a top mold 10a, so that a resin upper thickness A of the mold resin 5 above a semiconductor chip 1 is larger than a resin lower thickness B of the mold resin structure 5. Therefore, the semiconductor device is warped as a whole in a concave form wherein the side of the semiconductor chip 1 is recessed. The warp ratio of the mold resin structure of the eighth embodiment is more than 0.005.

FIG. 9 shows a ninth embodiment of the semiconductor device according to the present invention.

As shown in FIG. 9, a bed 3 of a lead frame 2 is slightly pressed downwards with respect to the other portions of a lead frame 2. A top mold 10a of a metal mold 10 for resin sealing has a recess 13 inside thereof, whereby a mold resin structure 5 has a protrusion 14 projecting upwards. Therefore, a resin upper thickness A of the mold resin structure 5 above a semiconductor chip 1 is larger than a resin lower thickness B of the mold resin structure 5 below the semiconductor chip 1. The semiconductor device is warped in a concave form on the upper side of the mold resin structure 5. The warp ratio of the resin mold structure 5 is more than 0.005.

FIG. 10 shows a tenth embodiment of the semiconductor device according to the present invention.

In FIG. 10, a semiconductor chip 1 is connected through a bump 6 to a TAB lead 7. The TAB lead 7 is connected to an inner lead 2a of a lead frame 2. The semiconductor chip 1 and the adjacent wiring area thereof are completely encapsulated and resin-sealed by a mold resin structure 5, and an outer lead 2b of the lead frame 2 is shaped as shown, whereby the semiconductor device is constituted.

A resin upper thickness A of the mold resin structure 5 above the semiconductor chip 1 is considerably larger than a resin lower thickness B of the mold resin structure 5 below the semiconductor chip 1, so that the mold resin structure 5 is warped as a whole in such a convex form that the side of the semiconductor chip 1 or the lower side of the mold resin structure 5 is protruded.

The warp ratio of the mold resin structure of this embodiment is more than 0.005.

In the above embodiments, the resin upper thickness A of the mold resin structure above the semiconductor chip 1 is differentiated from the resin lower thickness B of the mold resin structure below the semiconductor chip 1, so that the mold resin structure is warped. In addition to such warping of the mold resin structure, the warp ratio of the mold resin structure may be adjusted by providing a difference in the heating temperature between the top mold 10a and the bottom mold 10b of the metal mold 10 for resin sealing as shown in FIG. 3.

Comparative tests were carried out to verify the improvement by the present invention.

The test examples are those of the sixth embodiment as shown in FIG. 6 having respective warp ratios of 0.0025, 0.005, and 0.01, and one of the second embodiment as shown in FIG. 2 having a warp ratio of 0.005. The breakage of the passivation layer was checked after molding and after a heat cycle test. Heat and humidity tests were performed on the devices of the above examples.

Figure 11:
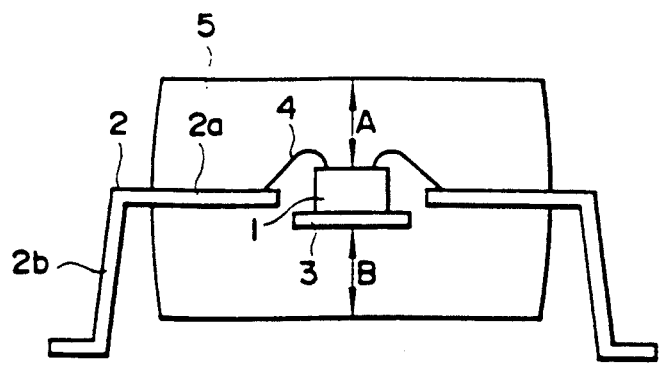
FIG. 11 is a cross-sectional side view of a conventional resin-sealed semiconductor device.
Figure 12:
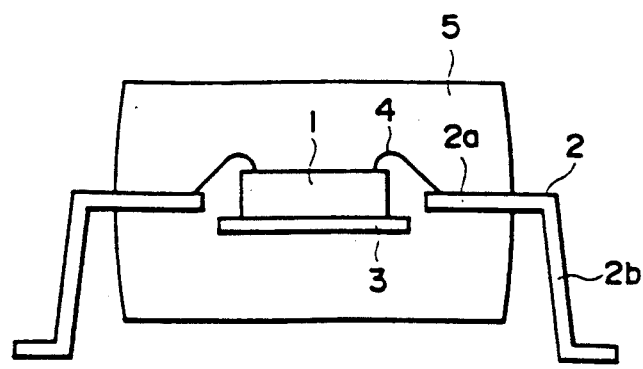
FIG. 12 is a cross-sectional side view of still another conventional resin-sealed semiconductor device.

The test results are shown in the following table. The conventional examples as shown in FIGS. 11 to 12 are also tested for comparison and listed in the table.

TABLE

|  | Breakdown of passivation layer | | High temperature humidity test (temperature 85° C. relative humidity 85%) | | |
| --- | --- | --- | --- | --- | --- |
|  | After molding | After heat cycle | 1000 hrs | 2000 hrs | 3000 hrs |
| Embodiment 2 warp ratio of 0.005 | None | None | Good | Good | Poor |
| Embodiment 6 warp ratio of 0.0025 | None | None | Good | Good | Good |
| Embodiment 6 warp ratio of 0.005 | None | None | Good | Good | Good |
| Embodiment 6 warp ratio of 0.01 | None | None | Good | Good | Good |
| Comparative example (prior art of FIG. 11) | None | None | — | — | — |
| Comparative example (prior art of FIG. 12) | Yes | Yes | — | — | — |

It is apparent from the table that the passivation layer is not broken in the sixth embodiment of FIG. 6 and in the second embodiment of FIG. 2, if the warp ratio of the mold resin structure is more than 0.0025. In the sixth embodiment, the resin upper thickness A of the mold resin structure above the semiconductor chip is so large (as in FIG. 6) that water may not readily reach the semiconductor chip, whereby the humidity resistance of the semiconductor chip is improved.

As described above, according to the present invention, the force applied to the semiconductor chip by the mold resin is absorbed as the warp moment upon contraction of mold resin structure after being formed. Therefore, the force applied onto the semiconductor chip is minimized so that the breakage of the passivation layer of the semiconductor chip is prevented.

Many widely different embodiments of the present invention may be constructed without departing from the spirit and scope of the present invention. It should be understood that the present invention is not limited to the specific embodiments described in the specification, except as defined in the appended claims.

I claim:
1. A resin-sealed semiconductor device comprising:
a semiconductor chip;

a mold resin structure completely encapsulating and sealing said semiconductor chip with resin upper and lower thicknesses, respectively, above and below said chip; and an outer lead having a part projecting out of said mold resin structure and electrically connected to said semiconductor chip;

wherein the resin upper thickness is differentiated from the resin lower thickness so that the resulting warp ratio of the molded resin structure is more then 0.0025, and the entire outer surface of said resin-sealed semiconductor device except for the outer lead consists of the mold resin structure.

2. The resin-sealed semiconductor device according to claim 1, wherein the resin upper thickness is greater than the resin lower thickness.

3. The resin-sealed semiconductor device according to claim 1, wherein the resin upper thickness is less than the resin lower thickness.

4. The resin-sealed semiconductor device according to claim 1, wherein said mold resin structure has a protrusion.

* * * * *